United States Patent [19]

Beall et al.

[11] 3,903,404

[45] Sept. 2, 1975

[54] COMPUTER CONSTRUCTION AND METHOD

[75] Inventors: Robert J. Beall, San Jose; Fred K. Buelow, Los Altos; John J. Zasio, Sunnyvale, all of Calif.

[73] Assignee: Amdahl Corporation, Sunnyvale, Calif.

[22] Filed: Oct. 17, 1973

[21] Appl. No.: 407,251

[52] U.S. Cl. .................................. 235/152; 317/100

[51] Int. Cl. ............................................ H05k 5/00

[58] Field of Search ............ 317/100, 101 C, 101 D, 317/101 DH; 29/625; 174/DIG. 5, 15 R, 16 R; 235/152

[56] References Cited

UNITED STATES PATENTS

| | | | |
|---|---|---|---|
| 3,646,399 | 2/1972 | Mars et al. | 317/100 |
| 3,701,928 | 10/1972 | Davis | 317/100 |
| 3,737,728 | 6/1973 | Austin et al. | 317/100 |

FOREIGN PATENTS OR APPLICATIONS

| | | | |
|---|---|---|---|
| 1,018,623 | 1/1966 | United Kingdom | 317/100 |

OTHER PUBLICATIONS

Kryzaniwsky, IBM Technical Disclosure Bulletin, Chip Air Cooling Arrangement, Vol. 14, No. 10, March 1972, pp. 2911.

*Primary Examiner*—Charles E. Atkinson
*Attorney, Agent, or Firm*—Flehr, Hohbach, Test, Albritton & Herbert

[57] ABSTRACT

Computer construction having a framework with a planar power buss mounted in the framework and having holes therein with printed circuit cards mounted on both sides of the power buss and positioned near the holes with very short interconnecting wiring for the printed circuit cards extending through the holes. Separate voltage and ground planes are provided in the power buss. A push-pull cooling system is provided for the printed circuit cards.

36 Claims, 26 Drawing Figures

PATENTED SEP 2 1975

3,903,404

SHEET 9

COMPUTER CONSTRUCTION AND METHOD

BACKGROUND OF THE INVENTION

The present invention relates to computers and more particularly to central processing units for use in such computers. Central processing units have heretofore been provided in large scale computers. However, they have had serious shortcomings. For example, they have been of relatively large size and therefore, it has been very difficult, if not impossible, to achieve very high clock cycle rates which therefore reduced the capabilities of the computer. In addition, there has been difficulty in such units and in providing for adequate cooling. There is, therefore, a need for a new and improved computer construction and a method for making the same.

SUMMARY OF THE INVENTION AND OBJECTS

The computer construction consists of a framework with a power buss mounted on the framework. The power buss is in the form of a rigid laminated structure having a first plate of conducting material serving as a voltage plate and a second plate of a conducting material serving as a ground plate. Insulating means is disposed between said first and second plates. The laminated structure is formed with holes extending therethrough. Printed circuit cards are mounted on each side of said power buss and are supported thereby. The printed circuit cards are electrically connected to the voltage and ground plates. Cabling extends through the holes and interconnects the printed circuit cards.

In general, it is an object of the present invention to provide a computer construction which is relatively compact in size and which makes it possible to achieve very high clock cycle rates.

Another object of the invention is to provide a computer construction of the above character in which threedimensional packaging it utilized.

Another object of the invention is to provide a computer construction of the above character in which cable lengths have been significantly decreased.

Another object of the invention is to provide a computer construction of the above character in which connector sizes have been substantially reduced.

Another object of the invention is to provide a computer construction of the above character in which a planar power buss is utilized and which is provided with holes therein.

Another object of the invention is to provide a computer construction of the above character in which it is possible to mount printed circuit card assemblies on both sides of the power buss and to provide very short interconnecting cabling between the printed circuit card assemblies.

Another object of the invention is to provide a computer construction of the above character in which it is possible to obtain almost direct access between printed circuit card assemblies on opposite sides of the planar power buss.

Another object of the invention is to provide a computer construction of the above character in which the power buss is utilized for the distribution of power and also serves as the structural support element for the printed circuit card assemblies.

Another object of the invention is to provide a computer construction of the above character in which the printed circuit card assemblies are covered to provide cooling channels for the devices mounted on the printed circuit card assemblies.

Another object of the invention is to provide a computer construction of the above character and a method in which a push-pull cooling system is utilized so that there is adequate cooling for the printed circuit card assemblies even though a portion of the cooling channel for one of the cooling channels has been removed.

Another object of the invention is to provide a computer construction and method of the above character in which there is very little loss of air velocity across a printed circuit card assembly even though the cooling channel has been interrupted.

Another object of the invention is to provide a computer construction and method of the above character in which the heat from the power supply is in separate paths discharged away from the printed circuit card cooling channels.

Another object of the invention is to provide a computer construction of the above character which has a relatively quiet cooling system.

Another object of the invention is to provide a computer construction of the above character in which the possibility of liquids and debris entering the cooling channels has been minimized.

Another object of the invention is to provide a computer system of the above character in which conventional fans can be utilized.

Another object of the invention is to provide a computer construction of the above character which can be easily and readily maintained.

Another object of the invention is to provide a computer construction of the above character in which it is unnecessary to utilize a swinging power buss structure.

Another object of the invention is to provide a computer construction of the above character in which it is possible to interconnect signals into either end of the power buss.

Another object of the invention is to provide a computer construction of the above character in which the printed circuit card assemblies can be readily mounted upon the power buss and removed therefrom.

Another object of the invention is to provide a computer construction of the above character which makes it possible to provide a very short wiring between the printed circuit card assemblies on the power buss and the input/output channels on opposite sides of the power buss.

Additional objects and features of the invention will appear from the following description in which the preferred embodiments are set forth in detail in conjunction with the accompanying drawings.

DESCRIPTION OF THE PREFERRED EMBODIMENT

Figure 1:
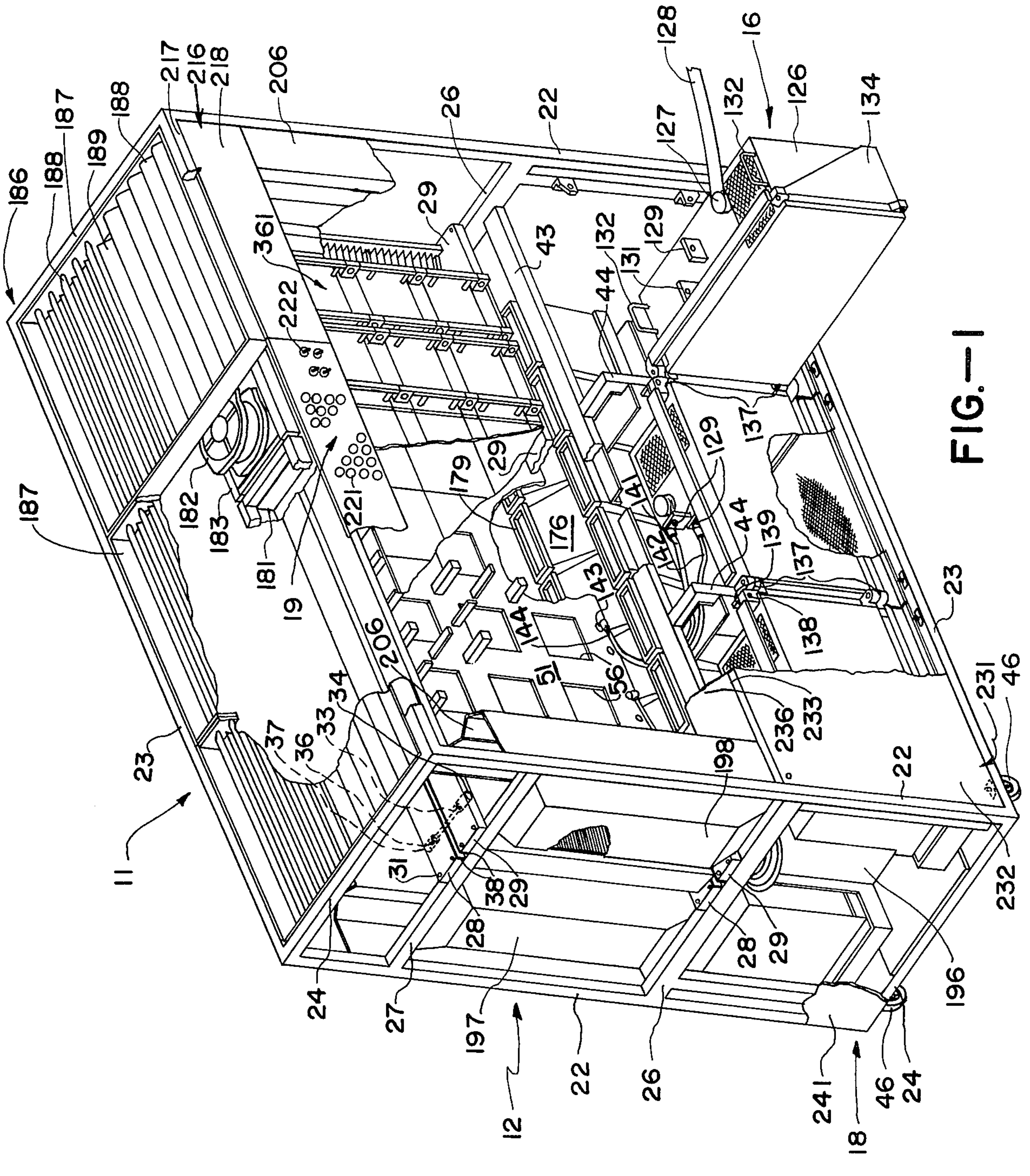
FIG. 1 is an isometric view with certain portions broken away of a central processing unit incorporating the present invention.

The computer construction which is shown in the drawings is generally in the form of a central processing unit, hereinafter called CPU, which forms a major portion of a large scale computer which includes in addition to the central processing unit, a buffer, channel and I/0 cable frame, a main storage unit and a power distribution unit. The CPU 11 which is shown in the drawings consists of a main framework 12 that is formed of steel tubing and acts as the main support for a planar power buss 13 which also may be termed an LSI (large scale integration) gate. As hereinafter explained, this power buss or LSI gate 13 is assembled and wired individually and then mounted in the main framework 12. A main power supply system 16 is mounted in the bottom of the main framework 12. A cooling system 17 is provided in the main framework 12 and is utilized in conjunction with the power bus 13 to provide cooling for the CPU. The main framework 12 and the parts hereinbefore described are mounted in a cabinet 18. A maintenance panel 19 is mounted in the cabinet.

MAIN FRAMEWORK 12

The main framework 12 is formed of a suitable material such as 1 inch square steel tubing. Thus, as shown in the drawing, there are provided a plurality of spaced vertical members 22, spaced horizontal longitudinally extending members 23 and spaced horizontal transversely extending members 24 to provide a box-like main framework 12. The members 22, 23 and 24 can be fastened together in a suitable manner such as by welding. A pair of additional spaced horizontal transversely extending bars 26 and 27 are mounted on each of the ends of the framework 12 and have mounted thereon two pairs of spaced horiziontal bars 28 and 29 by suitable means such as screws 31. The bars 28 and 29 are formed of a suitable material such as aluminum and extend longitudinally of the framework 12 between the front and rear sides of the framework.

Means is provided for mounting the power buss or LSI gate 13 between the bars 28 and 29 and consists of cap screws 33 which are countersunk in holes 34 (see FIG. 1) provided in the bar 29 and which extend through the power buss or LSI gate 13 and through the bar 28 where they are threaded into nuts 36 which are seated within holes 37 provided in the bar 28. The power buss or LSI gate 13 is insulated from the bars 28 and 29 in a suitable manner. Thus, the inner surface of each of the bars 28 and 29 facing the buss or gate 13 is provided with a strip 38 of a suitable insulating material such as an epoxy reinforced fiberglass bonded to the surfaces of the bar and engaging the buss or gate 13. An insulating sleeve (not shown) is mounted in the buss or gate 13 for receiving each of the cap screws 33 and serves to insulate the cap screw from the bus or gate 13. As can be seen from the drawing, the power buss or LSI gate 13 is relatively large and covers approximately one-half of the vertical surface area within the framework 12 and is disposed above the bottom of the framework and adjacent to the top of the framework. The power buss or LSI gate 13 is in the form of a planar laminated structure as hereinafter described.

The main framework 12 also includes means for receiving the power supply or system 16 and consists of a pair of spaced horizontal longitudinally extending frame members 43 secured to the transversely extending members 26 by suitable means such as welding. A plurality of spaced vertical L-shaped members 44 have their upper ends secured to the frame members 43 and have their lower ends secured to transversely extending members 24.

Figure 2:
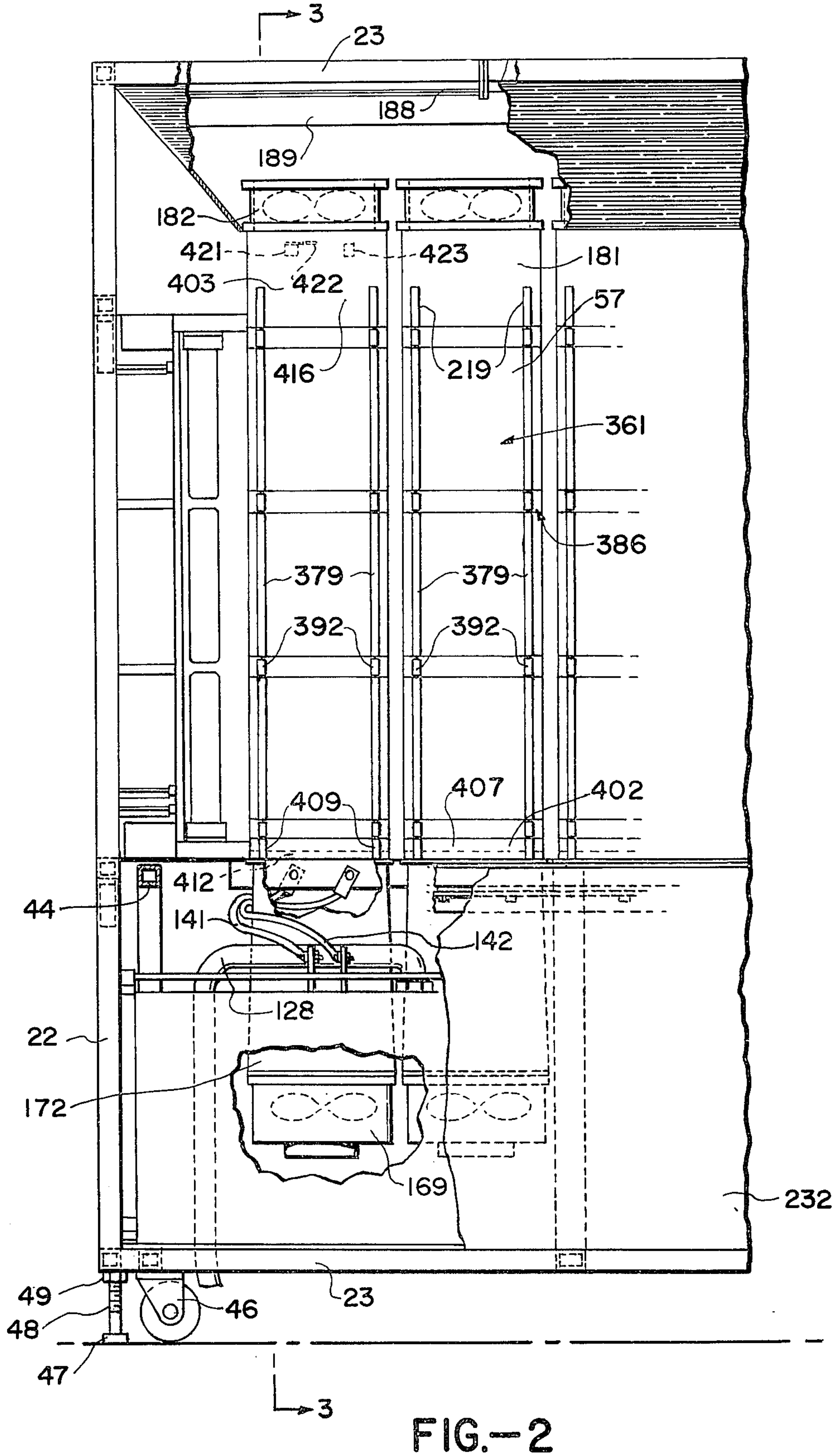
FIG. 2 is an enlarged partial front elevational view with certain portions broken away of the central processing unit shown in FIG. 1.

Four casters 46 are mounted on the bottom of the main framework 12 on opposite corners thereof so that the framework can be rolled from one location to another. In addition, there are provided foot members 47 which are carried by threaded rods 48 threaded into nuts 49 secured to the bottom of the framework 12 as shown in FIG. 2. By adjustment of the threaded rods 48, it is possible to move the foot members 47 into engagement with the floor on which the casters are riding to engage the floor and to retain the main framework in a stationary position so that it cannot be readily moved or shifted in position unless the foot members 47 are raised out of engagement with the floor.

POWER BUSS OR LSI GATE 13

The power buss or LSI gate 13 consists of a planar laminated structure 51. The structure 51 consists of two planar plates 52 and 53 (see FIG. 7) formed of a suitable conducting material such as aluminum. The plate 53 serves as the ground plate or plane and is substantially thicker than the plate 52 which serves as the voltage plate or plane. As hereinafter explained, the thickness of the plates 52 and 53 are insulated from each other in a suitable manner such as by the use of a conventional epoxy fiberglass sheet 54. The laminated structure or panel 51 is formed by placing the sheet 54 between the two plates 53 and 54 and clamping the same together and curing the epoxy.

The laminated structure 51 is provided with a plurality of large rectangular holes 56 which are spaced apart and distributed generally uniformly over the laminated structure into an array of 3 × 7 to provide a total of 21 holes in the structure. The holes 56 extend through the structure 51 to provide space for wiring as hereinafter described. It has been found that the square holes 56 shown give greater wiring capabilities than, for example, circular holes. The holes 56 are located in the laminated structure 51 in such a manner that each of the holes can be associated with a printed circuit card assembly 57 of the type described in copending application Ser. No. 407,181 filed Oct. 17, 1973, and which is adapted to overlie the hole. As disclosed therein, such a printed circuit card assembly is called a multiple chip carrier card assembly hereinafter referred to as an MCC card assembly.

Figures 6, 7, 8, 9, 10, 11, 12, 13, 14, 15:
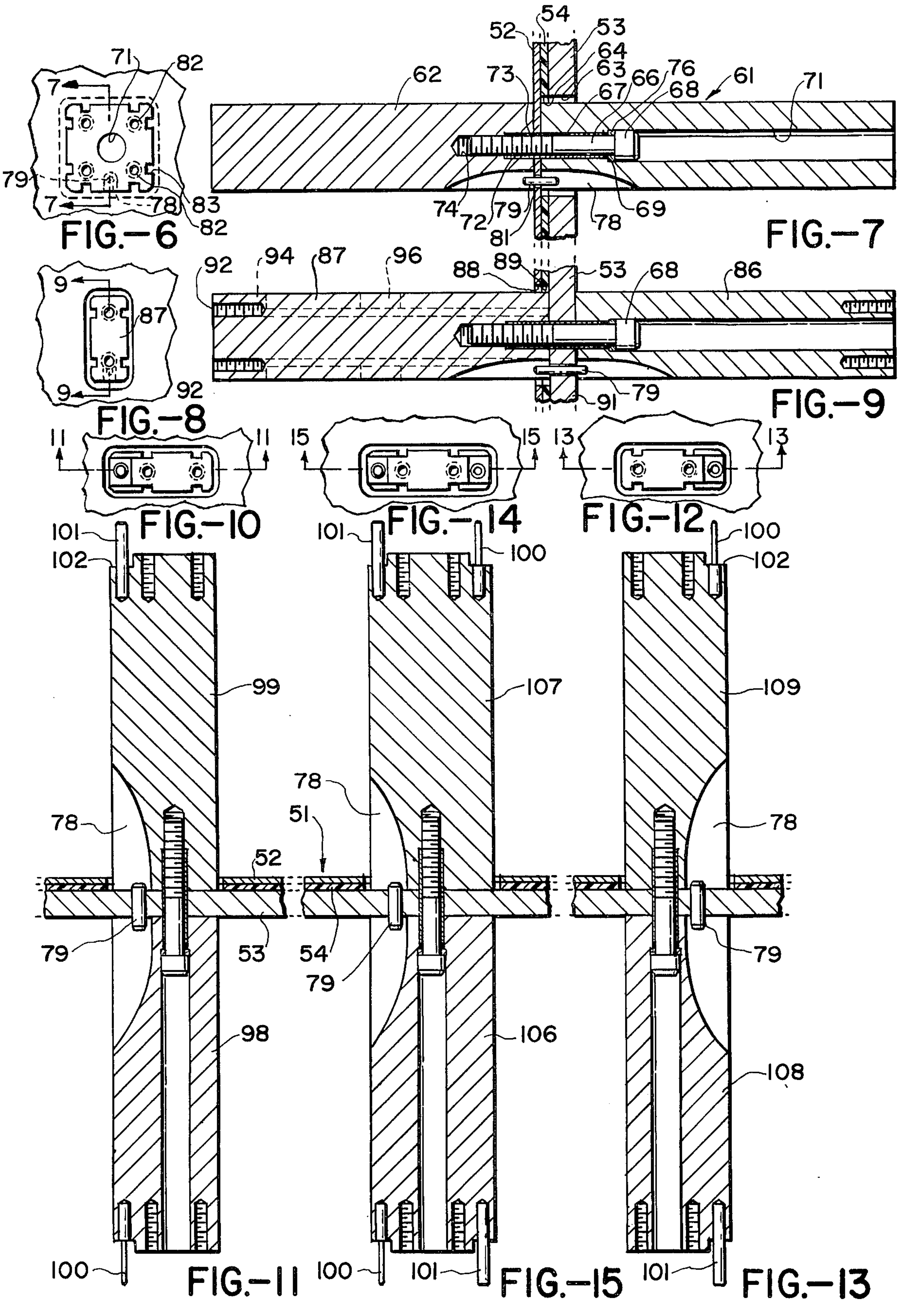
FIG. 6 is an enlarged view of a ground post encircled by the line 6—6 of FIG. 4.
FIG. 7 is a cross sectional view taken along the line 7—7 of FIG. 6.
FIG. 8 is an enlarged view of a power or voltage post encircled by the line 8—8 of FIG. 4.
FIG. 9 is a view looking along the line 9—9 of FIG. 8.
FIG. 10 is an enlarged view of a power post encircled by the line 10—10 of FIG. 4.
FIG. 11 is a cross sectional view taken along the line 11—11 of FIG. 10.
FIG. 12 is an enlarged view of a power post encircled by line 12—12 of FIG. 4.
FIG. 13 is a cross sectional view taken along the line 13—13 of FIG. 12.
FIG. 14 is an enlarged view of a power post encircled by line 14—14 of FIG. 4.
FIG. 15 is a cross sectional view taken along the line 15—15 of FIG. 14.

Means in the form of eight mounting posts is provided for mounting the MCC card assemblies on the power buss or LSI gate 13. The eight posts consist of four power or voltage posts and four ground posts. For this purpose a plurality of power or voltage posts 61 are provided on one side of the laminated structure 51 and a plurality of power or voltage posts 62 are provided on the other side of the laminated structure 51. Means is provided for mounting the power posts 61 and 62 on the laminated structure 51 in such a manner so that they only engage the voltage plate or plane 52. Thus, as shown in FIG. 7, holes 63 and 64 of a size slightly larger than the size of the power posts 61 are provided in the plate 53 and the insulating layer 54. Means is provided for mounting the posts 61 and 62 on the laminated structure 51 so that they only engage the voltage planar plate 52. Thus, as shown in FIG. 7, a cap screw 66 extends through a bore 67 and has a head 68 which is adapted to engage a shoulder 69 which is formed by a larger bore 71 provided in the post 61. The cap screw 66 also extends through a sleeve 72 which is disposed within the bore 67 and which extends through a hole 73 provided in the plate 52 and which extends into a threaded bore 74 provided in the post 62. The cap screw 66 is threaded into the bore 74 and engages a washer 76 which seats against the shoulder 69. Thus, it can be readily seen that by use of the cap screw 66, two of the posts 61 and 62 can be secured to the voltage plate 52 in such a manner that they are electrically connected to the voltage plate and extend at right angles to the plane of the voltage plate or plane. The use of the sleeve 72 makes it possible to readily assemble the power posts 61 and 62 on the voltage plate while still retaining very accurate positioning of the power posts.

The sleeve 72 is formed of a suitable material such as stainless steel. The washer 76 is also formed of stainless steel. During assembly of the posts, the posts are kept in alignment by the stainless steel bushing while the screw 66 is rotated and threaded into the threaded bore 71. Since the bushing is formed of stainless steel and the voltage posts are formed of aluminum, there is no binding between the parts and the screw 66 can be readily threaded into the bore. The stainless steel washer 76 also prevents collapse of the aluminum around the shoulder 69.

In order for the MCC card assemblies 57 to be aligned on the laminated structure 51, it is important that the voltage posts be aligned very accurately vertically and horizontally or across the entire power buss or LSI gate 13. For this purpose, the inner extremities of the power posts 61 and 62 have been provided with machined slots 78 which are arcuate in cross section. These slots 78 permit a dowel pin 79 to be inserted into an accurately dulled hole 81 provided in the voltage plate 52. The dowel pin 79 in the hole 81 in cooperation with slot 78 accurately aligns the power post and prevents the power posts from rotating off axis. The outer ends of the voltage posts 61 and 62 are provided with four accurately threaded bores 82 which are precisely positioned in the four corners of the posts as shown particularly in FIG. 6. In addition, each side of the posts 61 and 62 is provided with two spaced parallel milled slots 83 which extend the length of the same. The power or voltage posts 61 and 62 have been constructed in such a manner that the four corners of four separate MCC card assemblies 57 can be supported by each of the power or voltage posts 61 and 62.

The ground posts include ground posts 86 and 87 (see FIGS. 8 and 9) which are secured to the ground plate or plane 53 in a manner very similar to the power posts 61 and 62. Thus, the ground posts 87 extends through a hole 88 provided in the voltage plate 52 and a hole 89 provided in the insulation layer 54 and makes contact with one side of the ground plate 53, whereas the ground post 86 makes contact with the other side of the ground plate. The means for mounting the two posts 86 and 87 is identical to that used in connection with the power posts and therefore, it will not be described in detail. Alignment of the ground posts 86 and 87 is maintained in the same way as for the power posts 61 and 62. The dowel pins 79 extend through holes 91 provided in the ground plate 53. The outer ends of the ground posts 86 and 87 are provided with two spaced threaded bores 92 adjacent the minor sides (see FIG. 8) as shown. The two major sides of the ground posts 86 and 87 are provided with a pair of spaced parallel milled slots 93 extending longitudinally of the same. Notches 94 and 96 are provided on each of the major sides of the ground posts 86 and 87 and open into the milled slots 93. The notches 94 are provided at the outer extremities of the ground posts 86 and 87, whereas the notches 96 are provided intermediate the ends of the slots 93 and are used for a purpose hereinafter described.

The ground posts include additional ground posts 98 and 99 which are very similar to the ground posts 86 and 87 with the exception that they are slightly wider so that they can carry a small registration pin 100 on the outer end of post 98 and a large registration pin 101 on the outer end of post 99 (see FIG. 11). The pins 100 and 101 are mounted in notches 102 provided on one side of the ground posts 98 and 99 as shown in FIG. 10. Additional ground posts 106 and 107 (see FIG. 15) are also provided which are similar to the ground posts 98 and 99 with the exception that one small registration pin 100 and one large registration pin 101 have been provided on the outer extremities of each of the ground posts. The registration pins 100 and 101 are of two different diameters as shown in the drawing so as to ensure that the MCC card assemblies 57 will be properly placed upon the ground posts as hereinafter described. Similarly, additional ground posts 108 and 109 (see FIG. 13) have been provided which are substantially identical to the ground posts 98 and 99 with the exception that the ground posts are positioned so that they face in an opposite direction than do the ground posts 98 and 99.

MAIN POWER SUPPLY SYSTEM 16

The main power supply system 16 consists of six separate power supply units 126 with three being provided on one side and three being provided on the opposite side of the main framework 12. The power supply units 126 can be of any suitable type which would be suitable for supplying a central processing unit. For example, ont type found to be suitable is one supplied by AC-DC of Los Angeles, California having an input voltage of 208 volts at 400 cycles and having an output of 300 amperes d.c. at a −5.2 volts. The power supply units 126 have a box-like configuration as shown in FIG. 1. Each of the power supply units is provided with an input plug 127 to which is supplied 208 volts at 400 cycles through a power cord 128. A pair of output lugs 129 and 131 which are provided on the top side of each of the power supply units so that they are readily accessible. A pair of spaced handles 132 on each unit facilitates movement of the power supply unit. Each of the power supply units is mounted in a table or tray 134 which is carried by a swinging door 136. The door 136 is rectangular in configuration and has the table or tray 134 secured thereto. The door has one side hingedly mounted upon the members 44 by hinges 137. Spaces are provided within the framework 12 so that the door 136 with the power supply unit 126 carried thereby can be swung inwardly so that the outer surface of the door is flush with the frame and then fastened in place by screws 138 threaded into brackets 139 carried by the members 44.

Flexible cables 141 and 142 are provided for connecting the −V voltage and the common or ground output lugs 129 and 131, respectively, to the respective −V voltage plate 52 and the ground or common plate 53. The cables 141 and 142 are connected to the respective plates 52 and 53 by bolts 143 connected to lugs 144 carried by the cables 141 and 142. By way of example, if the bolt 143 is to make connection to the voltage plate 152, then a large opening is provided in the other plate 53 so that the bolt will not engage the same by will only engage the plate 52 and the insulating layer 54. Conversely, when it is desired to engage the ground plate 53, the bolt only engages the plate 53 and the insulating layer 54 and not the plate 52. As can be seen from the drawings, the cable connections for the cables 141 and 142 for all six of the power supply units 126 are distributed longitudinally of the power buss or LSI gate 13 along the bottom extremity thereof.

COOLING SYSTEM 17

Figure 3:
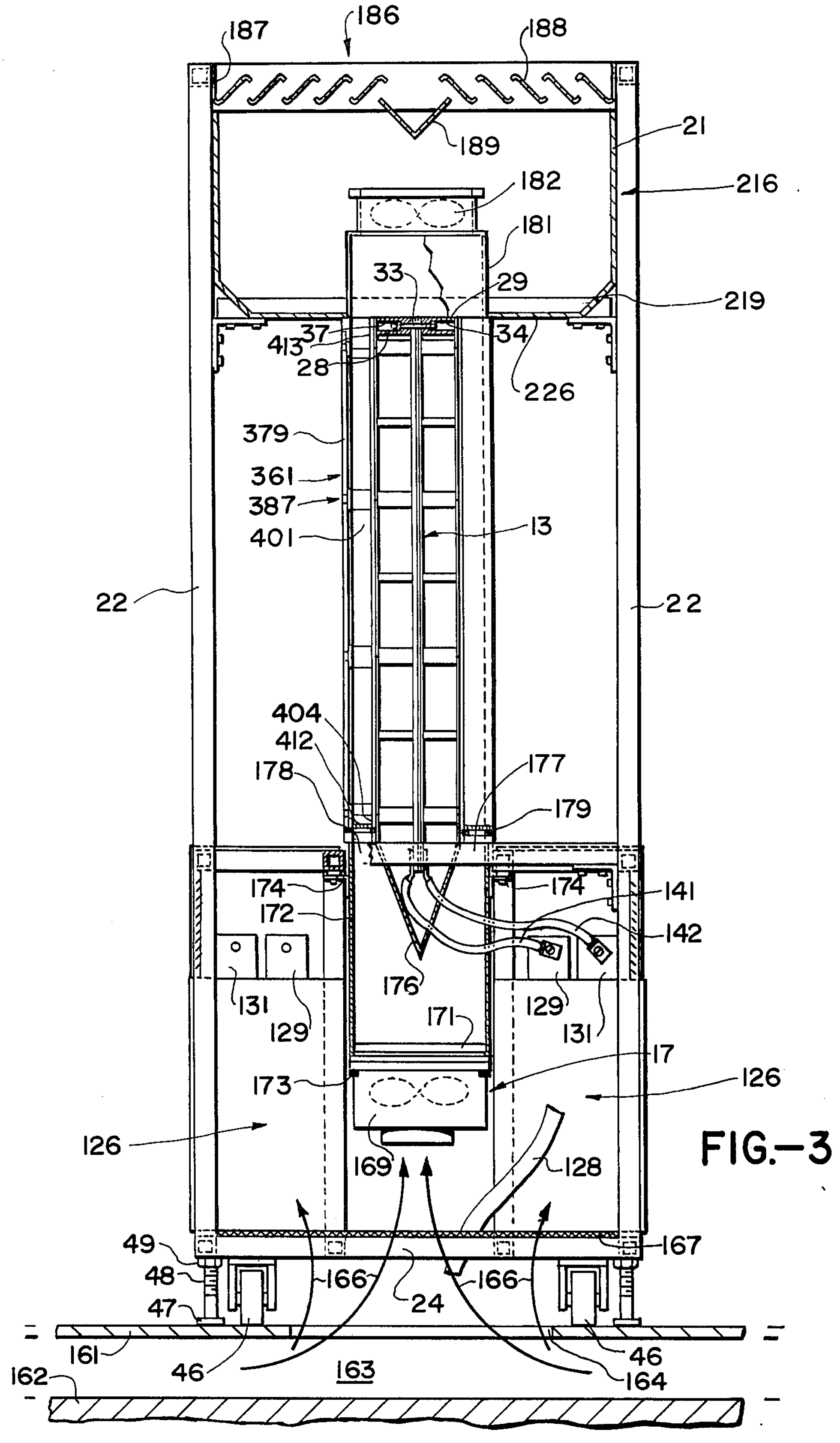
FIG. 3 is a cross sectional view taken along the line 3—3 of FIG. 2.

The central processing unit 11 is adapted to rest upon a computer floor 161 of a conventional type which is spaced above the sub-floor 162. The space 163 between the computer floor 161 and the sub-floor 162 serves as a plenum for the introduction of cooling air through a large openinng 164 extending longitudinally of the main frame 12 and extending the length of the main frame 12 so that cooling air can move upwardly into the main frame 12 as indicated by the arrows 166 (see FIG. 3).

The cooling air passes through air filters 167 provided in the bottom of the framework 12 and passes upwardly through the power supply units 126 to cool the same. The air also passes upwardly through a plurality of seven fans 169 extending longitudinally of the framework 12. The fans 169 are fastened to rectangular frameworks 171 carried by the lower extremities of the plurality of seven spaced box-like housings 172 spaced longitudinally of the framework 12. The housings. 172 of the fans 169 are secured to the frameworks 171 by suitable means such as screws 173. The housings 172 are formed of a suitable material such as sheet metal coated with a Plastisol. The housings 172 are mounted on the frameworks 171 in a suitable manner such as by the use of brackets 174 which are secured to the outer front and rear walls of the housings 172 and are secured to the bottom sides of frame members 26 of the framework. 12. Each of the housings 172 is provided with a single entrance to receive the cooling air introduced by the fan 169. This cooling air is divided into two branches within the housing by a V-shaped deflector 176 carried within the housing. The V-shaped deflector 176 in combination with the housing 172 forms two rectangularly shaped openings 177 and 178 (see FIG. 3) on opposite sides of the power buss or LSI gate 13 through which the cooling air exits to cool the MCC card assemblies 57 as hereinafter described. A gasket 179 formed of a suitable material such as polyurethane foam is provided on top of the housing 172 to circumscribe each of the openings 177 and 178. The V-shaped deflector 176 and the housing 172 are formed in such a manner that the openings 177 and 178 clear the bars 28 and 29 so that the cooling air passing therefrom will have clear access to the MCC card assemblies 57.

The air, after it has passed the MCC card assemblies 57 is collected by a plurality of seven box-like housings 181 which are secured to the tops of the bars 28 and 29 by suitable means such as screws (not shown). A plurality of seven fans 182 are secured to the top extremities of the housings 181 by a framework 183.

Fans 169 and 182 can be of any suitable type which will perform the necessary cooling. For the fans 169 to provide the necessary cooling in a relatively small space in a relatively quiet manner, it has been found that it is desirable to utilize a high power vane axial flow fans capable of operating against pressure up to ½ inch of water such as one manufactured by Rotron. For the fans 182, it has been found desirable to utilize another vane axial flow fan capable of operating against at least 0.3 of an inch of water such as Model 7550S supplied by Pamotor of Burlingame, California. The higher power Rotron fans have been provided in the bottom of the framework 12 rather than the top of the framework 12 because they are noisier in operation. The Pamotor fans have been selected for the top fans because they are relatively quiet in operation. The fans 169, 182 operate in a push-pull fashion as hereinafter described to provide the necessary cooling.

The housings 181 are also formed of a suitable material such as sheet metal and are coated with a suitable friction decreasing noise dampening material such as Plastisol. The housings 181 form transistion regions for the cooling air which then passes upwardly through a louvered three-section structure 186 which forms the top wall of the cabinet 18. Each section consists of a framework 187 which carries a plurality of louvers 188 which are S-shaped in cross-section and are inclined at an angle of approximately 45° so that the lower extremities are inclined toward the exterior of the framework 12. In addition, each section of the louvered structure 186 includes a V-shaped centrally disposed member 189. The V-shaped members in each of the three sections have their V's pointed downwardly (see FIG. 3), so that they overlie the LSI gate 13 and have an overall width so that they extend over the LSI gate 13, the MCC boards 57 and the cooling channels provided for the MCC boards. This is to prevent coffee or other liquids from spilling down into the MCC card assemblies 57 in the event such spillage should occur over the louvered structure 186. The louvered structure 186 also is formed of suitable sheet metal and is coated with a friction reducing and noise reducing material such as Plastisol.

Additional means is provided for confining the movement of cooling air through the framework 12 and consists of air shields 196 provided at opposite ends of the framework 12 on the lower extremities of the same between the power supply units 126. By having the power supply units 126 hingedly mounted as hereinbefore described, it is possible to obtain ready access to the fans 169 so that they can be readily serviced and maintained. In the upper part of the framework 12 on the opposite ends of the same there are provided a pair of covers 197 and 198.

In addition, there is provided on each side of the framework 12 adjacent the ends of the framework a side panel structure 206. The panel structure 206 extends in a vertical direction upwardly from the member 43 and up to an elevation level with the housings 181.

a top panel member 216 is provided on both sides of the framework 12. Each is hingedly mounted on the top of the framework 12 along a horizontal axis immediately behind the edge 217 of the panel member 216. The panel member 216 is provided with a front vertical surface 218 and rearwardly inclined surface 219. Each horizontal panel member 216 cooperates with the two spaced side panel structures 211.

The two top panel members 216 are identical with the exception that the top panel member 216 provided for the front has a plurality of lights 221 and a plurality of switches 222 mounted therein to form the maintenance and operating panel 19 of the CPU. Another horizontal top panel 226 is provided on each side (see FIG. 3) and extends outwardly from the housings 181. Panels 231 are provided for covering the power supply units 126. The panels 231 are removably mounted upon the framework 12 and provided with a vertical surface 232 and a horizontal surface 233. These panels 231 also mate with the panel structures 206 so that they in combination form a large rectangular recess 236 on each side to permit access to the MCC card assemblies 57.

Side panels 241 are provided which enclose the ends or sides of the rectangular framework 12 and form a part of the cabinet 18. A pair of large doors (not shown) are hingedly mounted upon both sides of the framework 12 and enclose the front and rear sides of the framework 12. The doors form a part of the cabinet 18.

MCC CARD ASSEMBLIES 57

The MCC card assemblies 57 each consists of a laminated circuit card of the type described in copending application Ser. No. 407,181, filed Oct. 17, 1973. As described in said copending application, the MCC card is a laminated multilayer epoxy glass printed circuit card 269 consisting of 10 conducting layers. Of these 10 layers, one is for voltage and another is for ground. The voltage layer is connected to four eyelets 271 which are provided in each of the four corners of the card. The ground layer is connected to four eyelets 272, one of which is provided on each of the four sides of the card half way between the voltage eyelets 271 on the corners of the card. The MCC cards 269 are provided with a plurality of plated-through holes 273 which are utilized in connection with connectors as hereinafter described. In addition, each card is provided with a small registration hole 274 and a large registration hole 276 which are adapted to mate with the small and large registration pins 100 and 101 provided on the ground posts 98, 99, 106, 107, 108 and 109.

Figure 20:
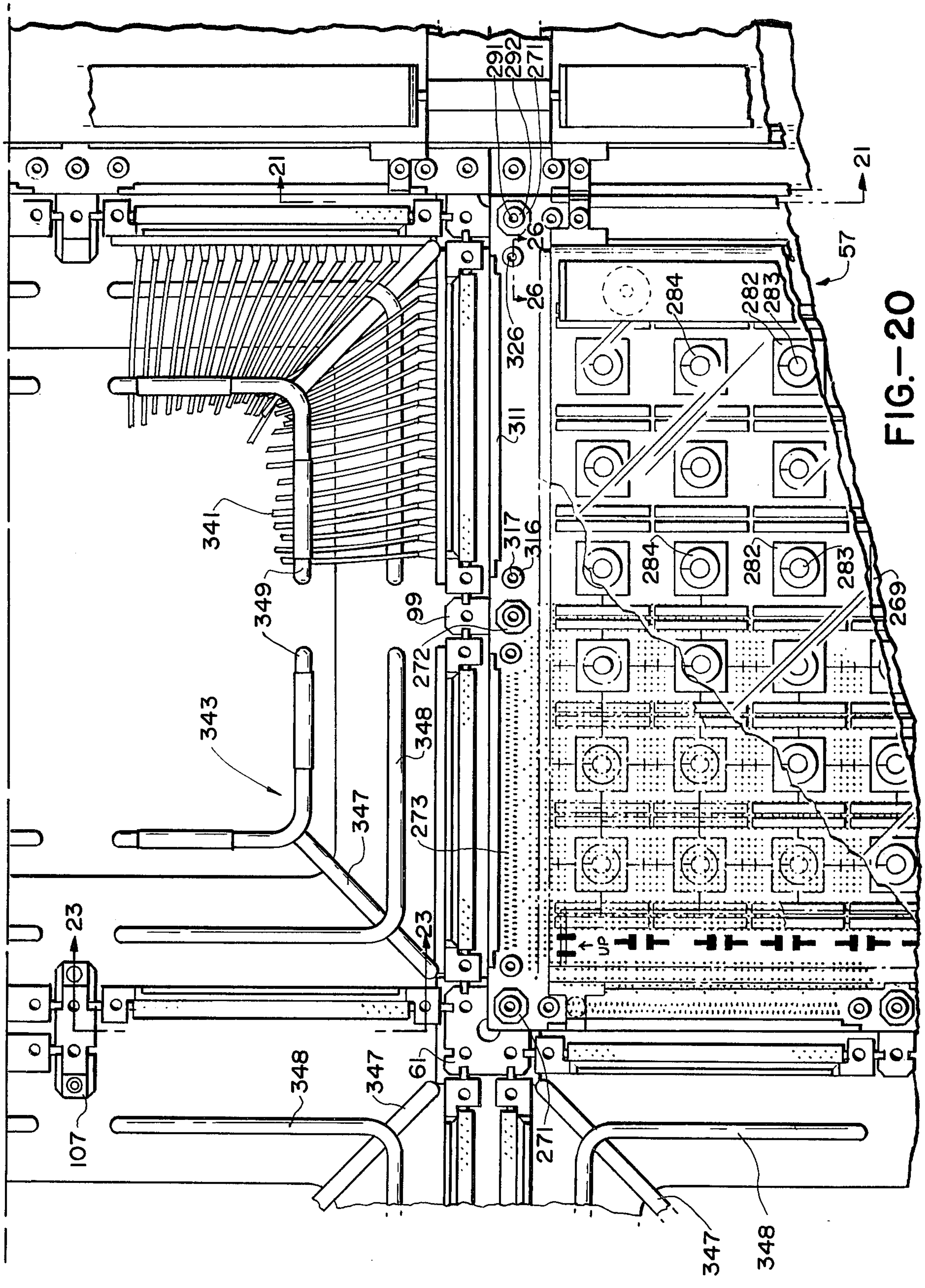
FIG. 20 is an enlarged view of a portion of the LSI gate encircled by the line 20—20 of FIG. 4.
Figures 21, 22:
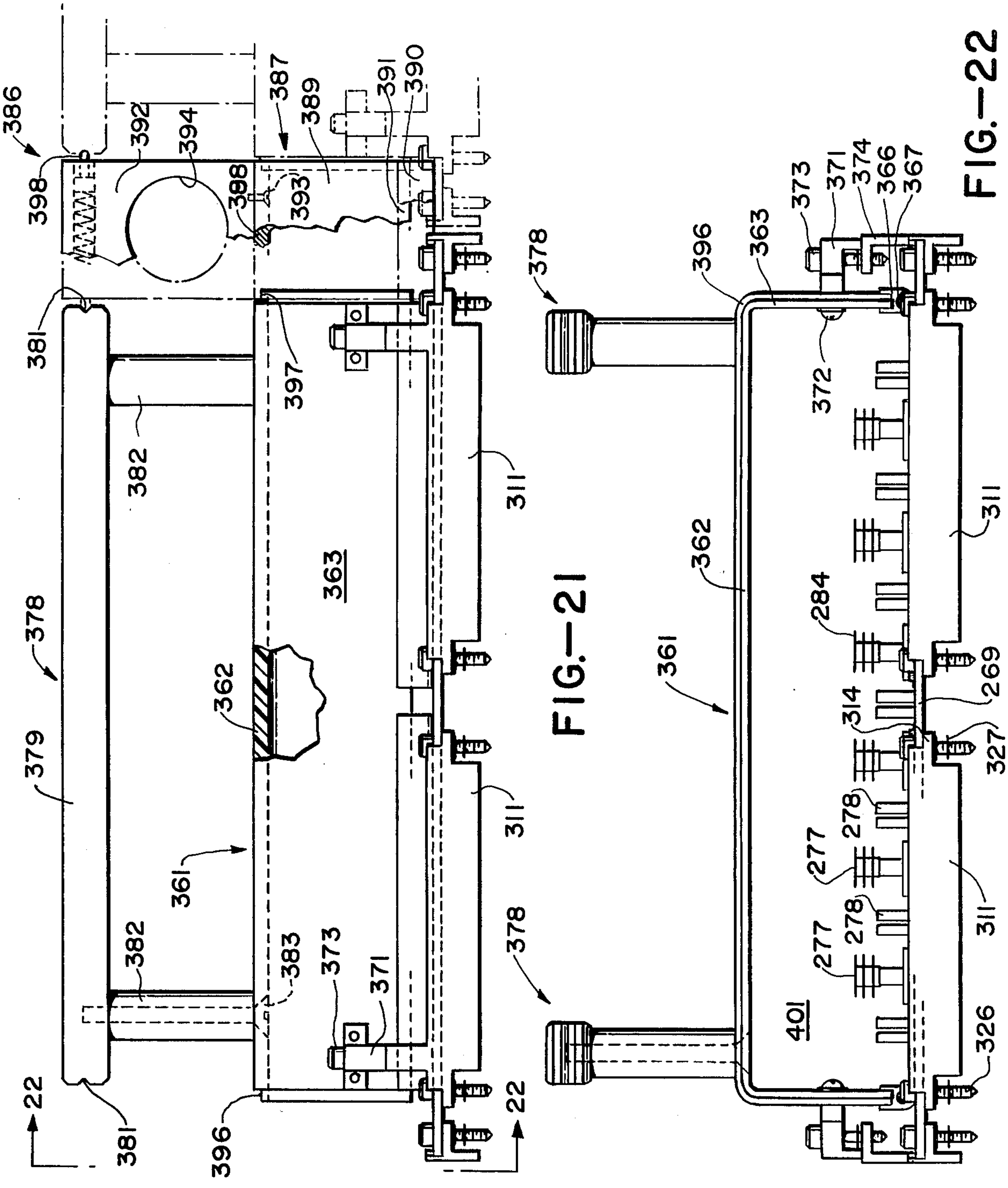
FIG. 21 is a cross sectional view taken along the line 21—21 of FIG. 20.
FIG. 22 is a veiw looking along the line 22—22 of FIG. 21.

Each of the MCC cards 269 has a capability of mounting 42 LSI chip packages 277 of the type described in copending application Ser. No. 270,448 filed July 10, 1972. In addition, each MCC card 269 has a capability of mounting R-packs or resistor packs 278 of 10 resistors and having a power and a ground lead. These resistors are used as terminating resistors for the circuits in the chip packages or carriers. The R-packs 278 are mounted between rows of chip carriers 277 at the edges thereof in seven double vertical columns for a total of 98 available R-pack positions. In addition, there is the capability on each MCC card for mounting two types of decoupling capacitors, one of which can be mounted through the board and the other is of a chip type which can be solder bonded directly to the surface of the MCC card. A portion of a typical MCC card assembly is shown in FIG. 20 of the drawings and has chip packages or carriers 277 mounted on the 42 possible positions. As described in said copending application Ser. No. 270,448, filed July 10, 1972, each of the carriers 277 is provided with a total of 84 leads which are bonded directly to lands or pads etched into the pattern provided on the MCC card. Such a carrier consists of a ceramic base 282 in which there is mounted an LSI chip of the type described in copending application Ser. No. 270,449, filed July 10, 1972. A cooling stud 283 is mounted on the base and is provided with cooling fins 284.

Means is provided for securing the MCC card assemblies 57 to the voltage and ground posts hereinbefore described and consists of cap screws 291 which are provided with holes 292 for Allen head wrenches. The screws 291 are mounted in the eyelets 271 and 272 and extend into the threaded bores 82 and 92 provided in the voltage posts and ground posts. The small registration hole 274 and the large registration hole 276 ensure that the MCC card assemblies are positioned in the proper manner on the voltage posts and ground posts and are not rotated through 180°.

Figures 23, 24, 25, 26:
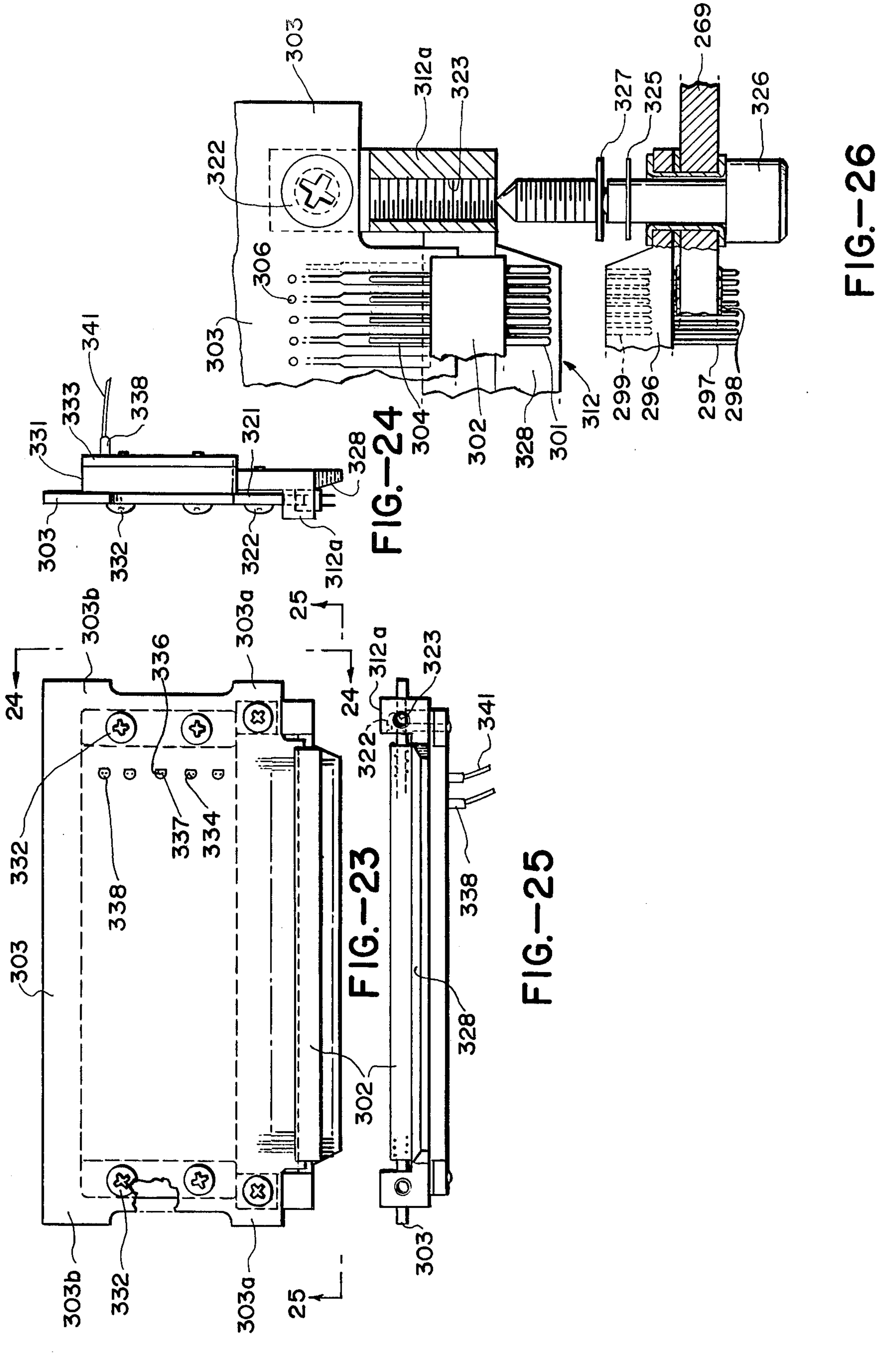
FIG. 23 is a plan view of a paddle card.
FIG. 24 is a view looking along the line 24—24 of FIG. 23.
FIG. 25 is a view looking along the line 25—25 of FIG. 23.
FIG. 26 is an enlarged view showing the manner of connection between a panel card and MCC card assembly.

A pair of connectors 296 of a suitable type such as 100 pin connectors supplied by Amp are utilized on each side of the four sides of the MCC card 269. Each of the connectors is provided with a plurality of pins 297 which are adapted to extend through are plated-through holes 273 provided on the MCC card 269. As can be seen from FIG. 26, the pins extend through the MCC card 269 at right angles to the plane of the card. Each of the connectors is provided with a female receptacle 299 for each of the pins 297 which is adapted to receive the pins 301 of another 100-pin connector 302. The connector 302 is mounted on one edge of a paddle board 303 which is a small multi-layer circuit board which carries a plurality of leads 304 that are formed thereon and are connected to the pins 301 of the connector 302. The paddle board 303 is generally rectangular in shape and is provided with two spaced ear-iike portions 304*a* and 304*b* on opposite ends thereof which are adapted to seat and travel within the recesses 83 provided in the voltage posts 61 and the slots 93 provided in the ground posts 86, etc. In this manner, it can be seen that each of the paddle boards will have one end mounted in a voltage post and have the other end mounted in a ground post. The dimensioning of the paddle board 303 and the slots or recesses 83 is such that the fit is relatively loose so that the paddle board can be readily shifted longitudinally of the slots. The dimensioning of the ear portions 304*a* and 304*b* is such that by shifting the paddle board longitudinally of the slots, it is possible to tilt the end of the paddle board adjacent the ground posts so that it can be canted or tilted outwardly through the notches 94 and 96 and thereafter removed from the slot 83 provided in the voltage post for repair or replacement. The paddle board 303 is provided with a plurality of plated through holes 306 which are connected with the leads 304 provided on the paddle board.

Means is provided for making and breaking the connection between the connectors 302 and 296 and consists of stiffeners 311 and 312 formed of a suitable material such as a metal. The stiffeners 311 are each provided with a recess 313 which is adapted to receive the edge of the MCC board 269. The stiffeners 311 generally lie in a plane which is perpendicular to the plane of the MCC card 269. Each of the stiffeners 311 is provided with a pair of ears 314 extending at right angles to the stiffener and which are adapted to be positioned on the back side of the card and are secured thereto by metal grommets 316 having holes 317 extending therethrough and which serve to secure the ears 314 to the MCC board 269.

Each of the stiffeners 312 is provided with enlarged end portions 312*a* which have slots 321 formed therein that are adapted to receive the ends of the paddle card 303. A screw 322 is threaded through the end portions 312*a* and secures the paddle card 303 to the stiffener 312. Each of the end portions 312*a* is provided with a threaded bore 323 which is adapted to be engaged by a jack cap screw 326 that is mounted on one of the holes 317 of the MCC card. The jack cap screw 326 is provided with a retaining ring 327 to prevent the cap screw from falling out of the MCC card. A washer 325 is mounted on the cap screw 326. As hereinafter described, the stiffener 312 extends in a plane which is parallel to the paddle card 303. The inclined surface 328 on the stiffener 312 serves to guide the connector 302 so that connection can be made with the connector 296.

A terminal block 331 formed of a suitable insulating material such as a plastic is mounted upon each of the paddle cards 303 by suitable means such as screws 332 (see FIG. 24) extending through the paddle card and through the terminal block and threaded into small metal end plates 333. The terminal block 331 is provided with a plurality of recesses 334 which open out through the terminal block in a direction which is generally at right angles to the plane of the paddle card 303. The recesses are provided with flat sides 336 and at the bottom thereof have a pair of spaced small holes 337 which mate with holes 306 provided in the paddle card. A plurality of plugs 338 formed of suitable material such as plastic are mounted in the recesses 334 and have a pair of pins (not shown) which extend through the holes 337 and make connection with the plated-through holes 306 provided in the paddle card. The pins are connected to a twin lead 341. The other ends of the twin leads 341 are connected to plugs 338 which are mounted in other recesses 334 and other terminal blocks 331.

Figure 19:
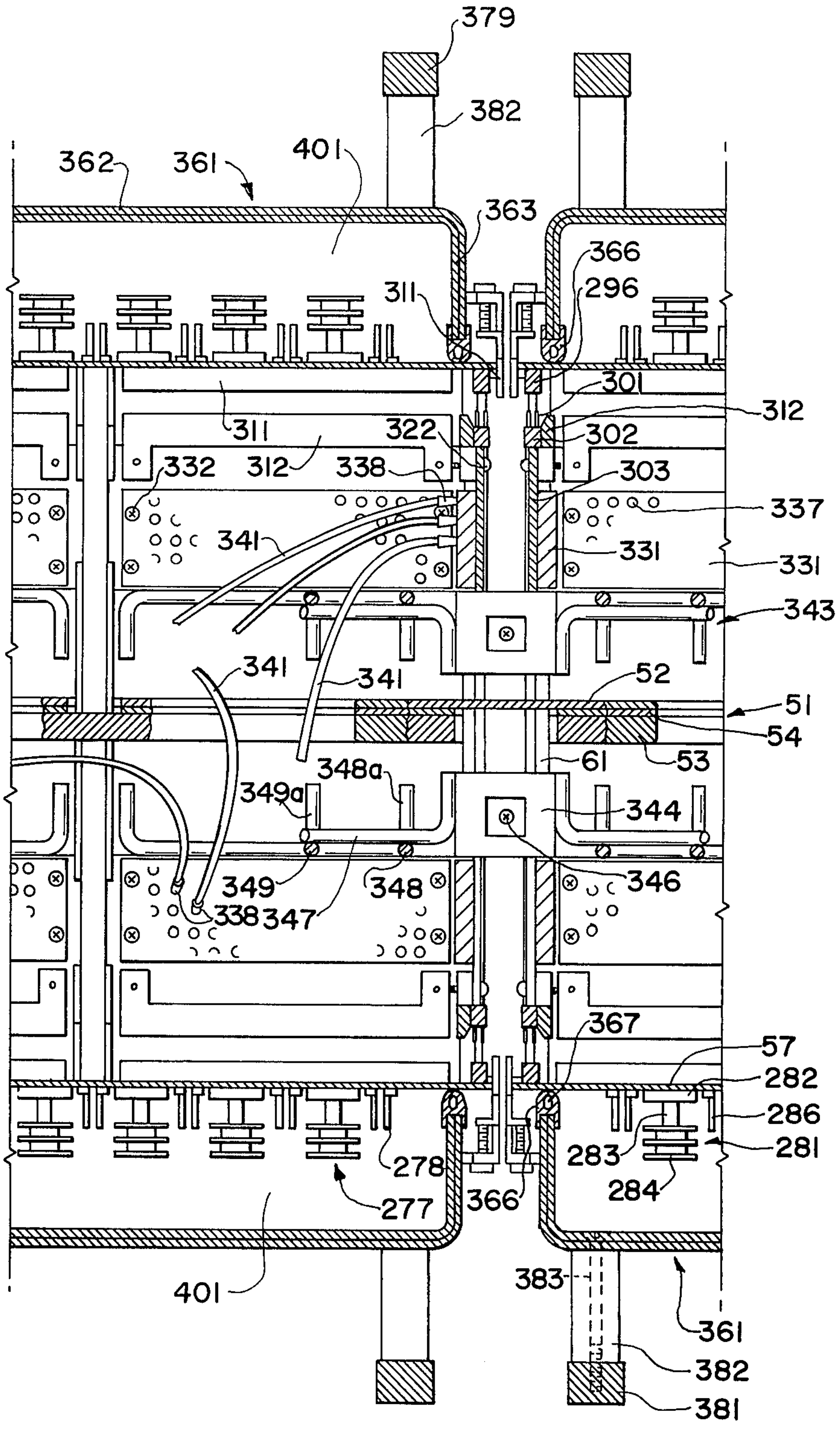
FIG. 19 is a cross sectional view taken along the line 19—19 of FIG. 4.

The leads 341 are guided by wire guides 343. The wire guides 343 consist of a sleeve 344 (see FIG. 19) which is square in cross-section and which slips over the voltage posts 61 and 62 and which is held in place by set screws 346. A plurality of arms 347 are provided on most of the sleeves 344 and extend outwardly into the space between the voltage posts at an angle of approximately 45°. The arms 347 carry sets of fingers 348 and 349 which extend at 90° angles with respect to each other and at 45° with respect to the arm 347. The fingers 348 and 349 are provided with depending portions 348*a* and 349*a* which extend at 90° angles with respect to the other portions of the fingers. The arms and the fingers of the wire guides can be formed of suitable material such as wire which has been coated with a suitable friction reducing material such as a Plastisol. The wire guides serve to position the wires and also serve to facilitate wiring of the CPU by making it possible to group the wires in recesses provided between the fingers.

Means is provided for establishing channels for the travel of cooling air over the chip packages or carriers 281 carried by the MCC cards 269 and consists of covers 361 which are generally U-shaped in configuration with open ends. The covers 361 are formed of a suitable material, preferably transparent, such as plastic. The covers 361 are molded so that they have a size which covers substantially all the MCC card 269, but still makes it possible to gain access to the cap screws 291 which are utilized for securing the MCC cards to the voltage posts and to the ground posts and to the cap screws 327 which are utilized for making the connections between the connectors 296 and 302. Thus, the covers are provided with an outer or front wall 362 and two spaced parallel side walls 363. Thus, the rear side and the top and bottom ends are open.

In order to form a substantially air-tight seal between the parallel side walls 363 of the cover and the MCC card 263, a boot 366 formed of a suitable material such as rubber is secured to the outer extremities of the side walls 363. The boot 366 is provided with a hole 367 extending longitudinally along the length thereof to facilitate collapse of the boot and to thereby aid in making an air-tight sealing engagement with the MCC card.

Means is provided for securing the cover 361 to the MCC card 269 and consists of a bracket 371 which is secured on the outer surface of each end of each of the side walls 363 by screws 372. A cap screw 373 is mounted in the bracket 371 and is adapted to threadedly engage a cover support member 374. The cover support member 374 is secured to the MCC card 269 in a suitable manner such as by the grommets 316. The cover support member is provided with a recess 376 to permit the cap screws 326 to be inserted in the holes 317. Thus, it can be seen that a cover 361 can be removably secured to the MCC card 269 so that it forms the MCC card assembly 57.

Means is provided for handling the MCC card 269 with the cover 361 secured thereto and consists of a pair of spaced handles 378 which are mounted on the front wall 362 of the cover adjacent the sides of the same. Each of the handles consists of an elongate bar 379 formed of a suitable material such as aluminum which has V-shaped notches 381 in opposite ends of the same. Each of the bars is mounted upon a pair of posts 382 and are secured to the front wall 362 of the cover 361 by screws 383.

As can be seen from FIGS. 1 and 2, the MCC card assemblies 57 are in alignment in such a manner that the covers in combination with the cards 269 form ducts or channels for cooling air. Means is provided for enclosing the spaces between the covers 361 of the MCC card assemblies 57 and consists of transition assemblies 386 which are formed of U-shaped members 387 which have the same cross-sectional area as the covers 361 but are relatively narrow. Each member 387 is provided with a front wall 388 and a pair of spaced parallel side walls 389. The free extremities of the side walls 389 carry boots 390 similar to the boots 366. A plate 391 is mounted in the U-shaped member 387 and provides the rear wall of the transition assembly. A pair of spaced handles 392 are mounted on the front wall 388 and are formed of a suitable material such as aluminum. They are generally square in cross-section and are secured to the front wall 388 by screws 393. Each of the handles is provided with a finger hole 394 through which a finger can be inserted.

The U-shaped members 387 and the covers 361 are provided with cooperative mating means whereby a relatively air-tight seal can be formed between the U-shaped members 387 and the covers 361 so that there is provided a continuous vertical channel or duct for cooling air. Thus, the covers 361 have been provided with a recess 396 extending inwardly from the outer surface along the upper and lower extremities of the same and, similarly, the members 387 have been provided with a recess 397 extending outwardly from the inner surface so that the two recesses 396 and 397 can mate with each other to provide a relatively air-tight seal.

Means is provided for retaining the transition assemblies 386 in their proper positions with respect to the covers 361 and consists of spring-loaded pins 398 carried by the sides of the handles 392 and adapted to engage the V-shaped notches 381 provided on the bars 379 of the handles 378 carried by the covers 361. The spring-loaded pins serve to retain the transition assemblies 386 in place after the pins have been forced into the notches 381 and, conversely, also permits the transition assemblies 386 to be removed by merely exerting a pulling force on the handles 392 to cause the spring-loaded pins 398 to clear the notches 381.

Means is provided for forming a conduit or duct from the rectangular openings 177 and 178 and the cooling channels 401 which are formed between the MCC cards 269 and their associated covers 361 and between the U-shaped members 387 and the plates 391 and consists of a framework 402 provided at the bottom of each of the cooling channels or ducts 401 and a framework 403 provided at the top of each of the cooling channels. The framework 402 consists of a sheet-like member 404 formed of a suitable insulating material such as plastic which is secured to the voltage and ground posts by cap screws 406. A U-shaped metal member 407 is secured to the member 404 and to the bar 29 by screws 408. The U-shaped member 407 carries a pair of spaced arms 409 which have notches 411 provided therein which are adapted to be engaged by the spring-loaded pins 398 of a transition assembly 386. The U-shaped member 407 rests upon the gaskets 179. Means is provided within the U-shaped member 407 for straightening the cooling air as it passes from the vane axial fans upwardly into each of the cooling channels 401 and consists of a sheet 412 of honeycomb material formed of a suitable material such as stainless steel. The honeycomb material has a suitable thickness as, for example, ¾ inch and has holes extending therethrough approximately ⅛ inch in width. This honeycomb material serves to straighten the air so that it will move linearly through the cooling channel 401 and also assures that there will be uniform velocity distribution within the cooling channel.

The top framework 403 also consists of a sheet-like member 413 which is secured to the voltage and ground posts by cap screws 414. A metal U-shaped member 416 is secured to the sheet 413 and to the bar 29 by screws 417. A pair of spaced arms 219 are mounted on the U-shaped member 416 and are similarly provided with notches 419 which are adapted to be engaged by the spring-loaded pins 398 of a transition assembly 386.

A microswitch 421 is mounted in each of the cooling channels 401 and is secured to the sheet 413. The microswitch carries a vane 422 which is of a size so that if the velocity of the air within the cooling channel drops below 2000 feet per minute, the microswitch will be actuated to shut down the CPU. A temperature sensing device 423 is also mounted upon the sheet 413 and will shut down the main power to the LSI gate in the event the cooling air temperature within the cooling channel goes above 53°C. ±3° C.

INTERCONNECTING CABLING

Figures 4, 5:
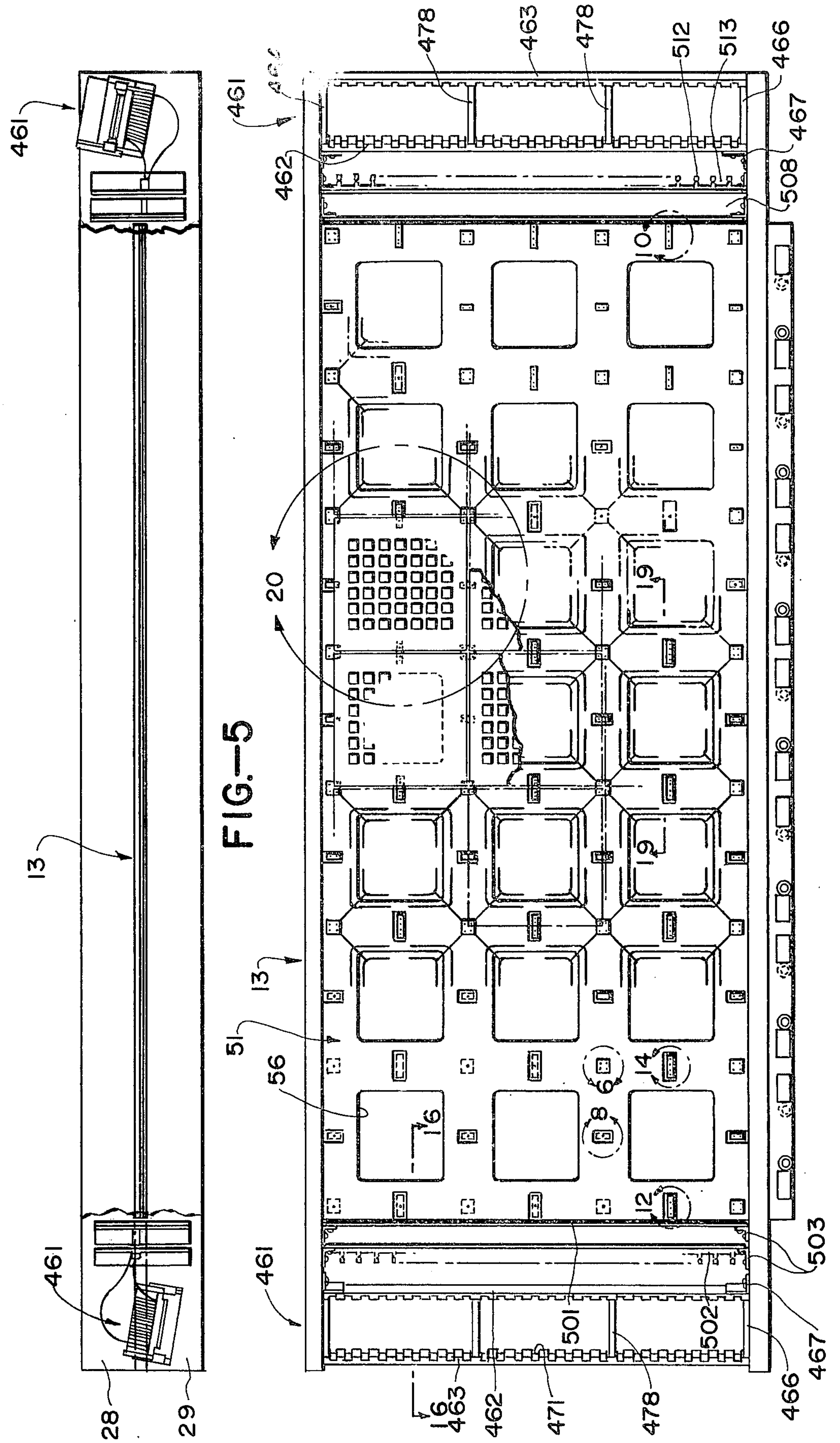
FIG. 4 is a front elevational view of the LSI gate or power buss.
FIG. 5 is a top plan view of the LSI gate shown in FIG. 4 with portions broken away.
Figure 16:
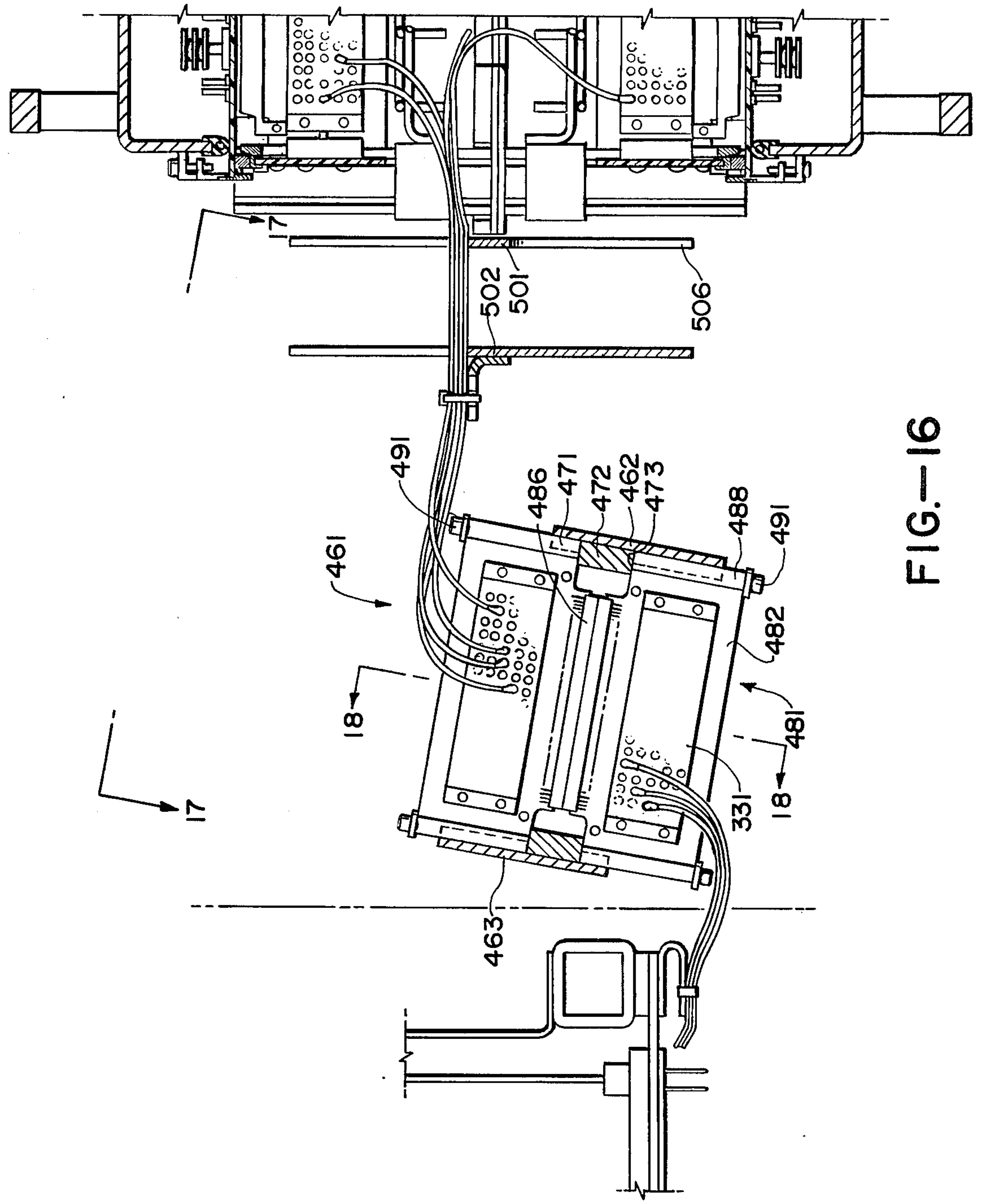
FIG. 16 is an enlarged cross sectional view taken along the line 16—16 of FIG. 4.
Figures 17, 18:
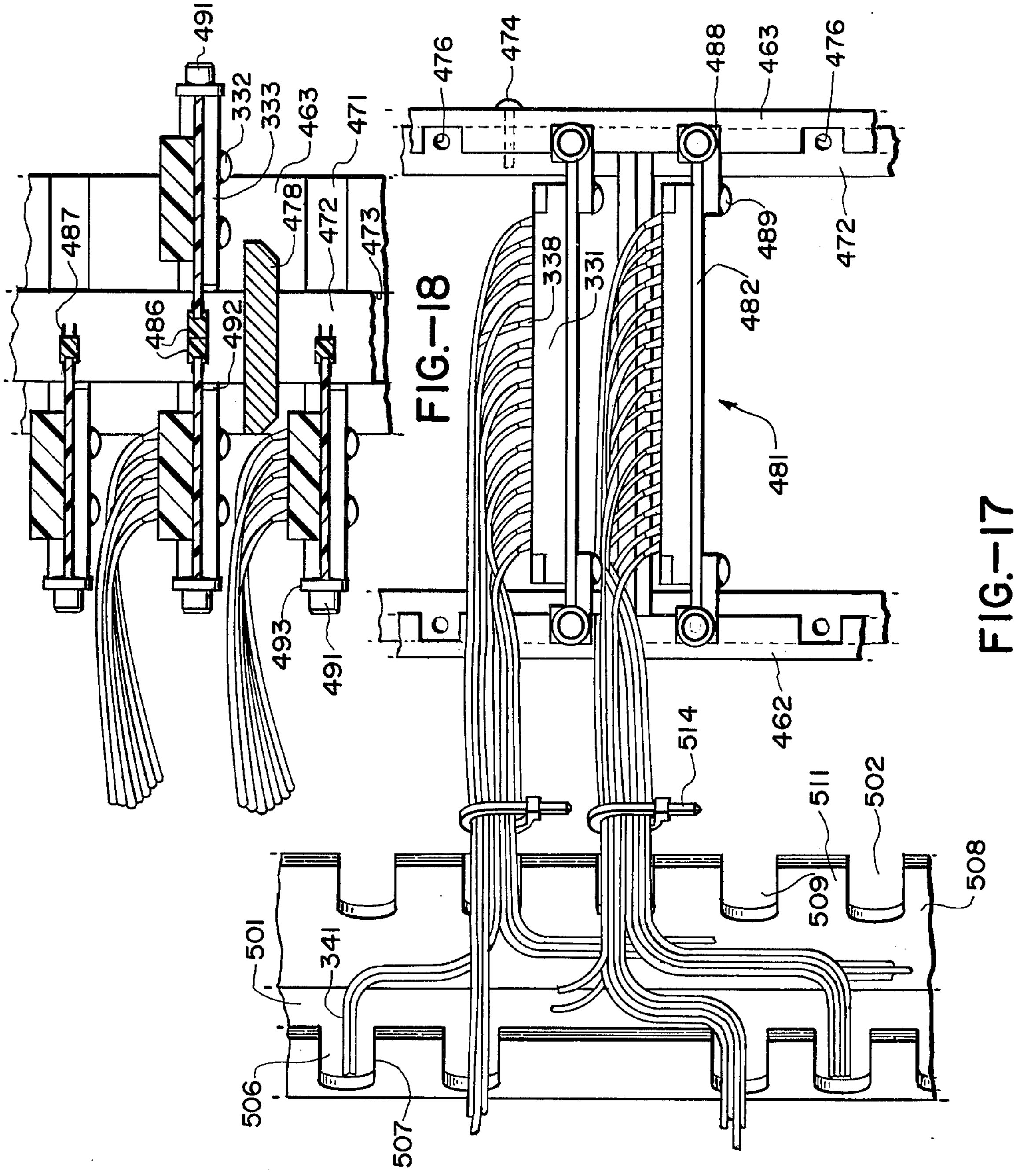
FIG. 17 is an enlarged view looking along the line 17—17 of FIG. 16.
FIG. 18 is an enlarged cross sectional view taken along the line 18—18 of FIG. 16.

The CPU is connected on one side to a buffer and the other side to a channel. Suitable cable connections must be provided for this purpose. Thus, at each end of the LSI gate 12, there has been provided a rectangular framework 461 (see FIGS. 4 and 16) formed of a suitable insulating material such as plastic. It is provided with two spaced parallel side wall members 462 and 463 and top and bottom walls 464 and 466. The framework 461 is secured between the two sets of parallel bars 228 and 229 by brackets 467. The inner surfaces of the side wall members 462 and 463 are provided with spaced parallel slots 471 which face inwardly and extend in a generally horizontal direction. A bar 472 formed of a suitable material such as aluminum is provided for each of the side wall members 462 and 462 and is mounted in a vertically extending slot 473 which passes through the slots 471 at right angles thereto in a region which is adjacent one end of the slots 471. The bar 472 is retained within the slot 473 by screws 474. The bar 472 is provided with a plurality of threaded bores 476 which are in alignment with the slots 471. Spacers 478 are provided within the framework 461 and are secured to the side wall members 462 and 463 by screws (not shown).

Panel card assemblies 481 are adapted to be mounted in the slots 471. Each of the panel card assemblies consists of a panel card 482 which is a multi-layer printed circuit card that carries a plurality of leads or conductors 483 which are connected to plated-through holes 484. A 100-pin connector 486 is mounted on the panel card and is connected to the conductors and is provided with a plurality of pins 487 which extend in a direction which is generally parallel to the plane of the panel card 482. A pair of members 488 formed of a suitable material such as plastic are secured to the ends of the panel card 482 by screws 489. A cap screw 491 is rotatably mounted in each of the members 488 and extends longitudinally therethrough in a plane parallel to the panel card and is retained therein by a retaining ring 492. A washer 493 is provided on each cap screw. The members 488 have a size so that they can slidably mount in the slots 471 and the cap screws 491 are such that they are adapted to threat into the bores 476 provided in the bar 472.

Each of the panel cards is provided with a terminal block 331 identical to that hereinbefore described and which is adapted to receive the plugs 338 in the same manner as hereinbefore described.

Means is provided for guiding the coaxial cable or leads as they leave the LSI gate 12 and they enter the input-output area for either the buffer or the channel and consists of a wire guide member 501 and a wire guide member 502. The wire guide members 501 and 502 extend between the two pairs of bars 28 and 29 and are secured thereto by suitable means such as brackets 503. Both the wire guide members 501 and 502 extend in a vertical direction and in a plane which is generally at right angles to the longitudinal axes of the bars 28 and 29, whereas the framework 461 is inclined at an angle as, for example, 30° with respect to the longitudinal axes of the bars 28 and 29.

The wire guide member 501 is provided with a plurality of spaced parallel fingers 506 which extend in horizontal planes to provide spaces which open in both directions to receive cables 341 from both sides of the LSI gate. The cables or leads 341 are inserted in the spaces 507 between the fingers 506 at the plane at which they leave the LSI gate. The cables 341 are then passed upwardly or downwardly or straight across in a wire channel 508 which is formed between the wire guide members 501 and 502 to the desired location for the input-output panel card assembly to which it is connected in the framework 461. The wire guide member 502 is provided with one set of spaced parallel fingers 509 which extend outwardly in generally horizontal planes to provide spaces 511 for the cables or wires. In addition, the wire guide members include a plurality of fingers 512 which are spaced apart and parallel and extend in a direction which is generally at right angles to the plane of the wire guide member to provide spaces 513 therebetween. The wires or cables 341 pass directly over to the panel card assemblies to which they are to be connected and have their plugs connected into the panel card assemblies.

After connections are made, the cables 341 are grouped into bunches and the bunches are tied by suitable means such as clamps 514 to the fingers 512 so that they are arranged in groups for easy identification. After the plugs for the wires have been inserted into the panel card assembly, the panel card assembly can be inserted into the framework 461 in the manner hereinbefore described and the cap screws 491 threaded into the bores 476.

The input-output panel card assembly for the other unit to which the connection is to be made as, for example, the buffer or the channel is mounted in a similar way on the other side of the framework 461 and its cap screw is utilized to move it inwardly so that the connectors 486 will be brought into engagement with each other. It is obvious that where the panel card assemblies are to be mated with each other, one should be of the male type having pins and the other should be of the female type having sockets for receptacles for receiving the pins. In this way, it can be seen that connections between the input and output panel cards which also can be called I/O connector cards of the LSI gate and the buffer or channel can be readily made. The traffic pattern for the cabling is such as to minimize the length of the cable as much as possible, and it is for this reason that the frameworks 461 are located close to the two vertical edges of the LSI gate 13 and have been canted at an angle so as to make it possible to effect the shortest possible wiring distance from a cable terminator card 303 on the LSI gate to the buffer or the channel. The cap screws 491 in the panel card assembly 241 serve to lock the panel card assembly into the framework. The cap or jack screws carried by the panel card assembly for the buffer or the channel are also used to engage and disengage the connectors carried by the panel cards. Each side of the LSI gate 13 is capable of conducting up to 1992 signals to an adjacent frame. The shortest wire distance from the closest MCC card edge to the center of the wire connector of the closest buffer or channel card is approximately 16 inches.

OPERATION

Operation of the CPU may now be briefly described as follows. Let it be assumed that the CPU has been placed in operation. Cooling air will pass upwardly from the space 163 through the opening 164, through the air filter 167 into the main framework 12 of the CPU. This air will pass upwardly into the power supply units 126, each of which has a self-contained fan as hereinbefore described. This air passes up through the top of the power supply unit until the air strikes the panels 231 and then the air is deflected either to the right or the left, depending upon the shortest path through the ends of the main framework 12 where the air passes upwardly through the space in the main framework between the panels 211 and 231 and the side or end panels 241 and then up through the air baffle structure 186 into the ambient air.

At the same time cooling air passes upwardly between the power supply units 126 into the bottom fans 169 which force the air pressure upwardly through the rectangular openings 177 and 178 and into the cooling channels 401 formed by the MCC card assemblies 57 and the transistion assemblies 386. The cooling air then passes through the top fans 182, through the air baffle or louver structure 186 provided in the top of the cabinet 18 and thence into ambient air within the room in which the CPU is located. As hereinbefore pointed out, means is provided at the bottom of each of the air columns formed within the cooling channels 401 to straighten the air as it passes from the bottom fans 169 so that the air will travel linearly through the cooling channels and also will be distributed uniformly throughout the cross-sectional area of the cooling channel. This will ensure uniform cooling of the packages or carriers 281 carried by the MCC cards 56. As hereinbefore pointed out, means is provided in each of the air columns formed within the cooling channels 401 for sensing when the air velocity within the column drops below a predetermined level as, for example, 1000 feet per minute and when the temperature drops below 57°C. ± 3°C. which information is utilized to shut down the CPU when the predetermined limits are exceeded or not met.

The construction of the MCC card assemblies 57 and the transition assemblies 386 is such that they can be readily removed. When it is desired to remove an MCC assembly, one of the transition assemblies 386 is removed by merely pulling it outwardly to cause the spring-loaded pins 398 to become disengaged from the V-shaped notches 381 provided in the bars 379 of the MCC card assemblies 57. As soon as this has been accomplished, the MCC card assembly 57 can be removed by first operating the jack screws 326 to cause the paddle cards 303 and their associated connectors 302 to be backed away from the MCC card assembly 359 so that the connectors 302 are separated from the connectors 296. This is readily accomplished because the paddle card 303 can move longitudinally within the slots 83 provided in the ground posts. After the paddle cards 303 have been separated from the MCC card assembly 57, the eight cap screws 291 holding the MCC card assemblies 57 in place on the voltage posts and the ground posts can be removed so that the MCC card assembly 57 can be removed merely by using the two hands to grasp the handles 378 and pulling the MCC card assembly 57 outwardly away from the LSI gate or power buss 13. It is important to note that it is unnecessary to shut the CPU down during the removal of one of the MCC card assemblies because sufficient cooling air still will be supplied to all of the remaining MCC card assemblies 57 in the cooling channel 401 from which the MCC card assembly 57 is removed.

This is true because the two fans, i.e., the bottom fan 169 and the top fan 182 associated with each cooling channel 401 operate in a push-pull manner in which the bottom fan 169 is pushing the air upwardly and the top fan is pulling the air upwardly. Thus, even though there is a gap in a cooling channel caused by the removal of one MCC card assembly 359, the cooling air will be pushed upwardly from the bottom fan 169 up to the gap and this cooling air will be pulled upwardly from the gap through the remaining MCC card assemblies 57 forming the cooling channel 401 even though one of the MCC card assemblies has been removed.

A replacement MCC assembly 57 may be readily inserted in the gap and the cap screws 291 inserted. The paddle cards 303 may then be moved outwardly toward the MCC card 269 and to cause the jack screws 326 to engage the threaded bores 323. By rotation of the jack screws 326 the connectors 302 are brought into engagement with the connector 296.

From the foregoing, it can be seen that a very efficacious system and method have been provided for cooling the CPU and in particular for cooling the chip packages or carriers 281 carried by the MCC cards 269. The R-packs are arranged in vertical rows so that cooling air can readily flow between the same. The cooling pins 284 on the LSI packages 277 are disposed so that they lie in vertical planes parallel to the path of air flow through the cooling channel 401.

It should be noted that the heat from the power supplies is directed away from the cooling channels 401 and is moved through separate paths through the CPU on opposite ends of the CPU. In this way, the heat from the power supply does not adversely affect the cooling which is provided for the MCC card assemblies 57. The cooling which is provided for the MCC card assemblies 57 is very effective because the cooling channel which is formed has one side of the same formed by the MCC card itself so that the cooling air is in direct contact with and passes over the MCC card and the chip packages or carriers 277 carried thereby.

The arrangement of the MCC card assemblies 359, in addition to providing efficacious cooling, is also advantageous in that it makes possible very short, compact cabling between MCC card assemblies 57. MCC card assemblies 57 are provided on both sides of the power buss or LSI gate 13 and are mounted on the voltage and ground posts as hereinbefore described so that they overlie the large holes or openings 56 in the laminated structure 51 which makes up the LSI gate 13 so that very direct routes may be utilized for the cabling between MCC cards. These large holes 56 with the wire guides 343 facilitate making the required cabling between the MCC cards by providing direct short paths between the MCC cards 269.

The construction of the MCC card assemblies 57 is such that the paddle cards 303 associated therewith also can be readily removed if desired. Thus, when an MCC card assembly 57 has been removed, one or more of the paddle cards 303 also can be readily removed merely by tilting one end of the same and causing the projections 303*a* and 303*b* to exit through the slots 94 and 96 provided in the ground posts, after which the other end of the paddle card 303 can be removed from the slot 83 provided in the voltage post to be free of the posts. Thereafter, if desired, the plugs 338 can be removed from the terminal block 331 carried by the paddle card so that the paddle card can be removed from the CPU and repaired or replaced.

The construction of the LSI gate in conjunction with the MCC assemblies 359 and the paddle cards 303 is such that there in effect is a three-dimensional packaging arrangement which is provided for the cards. This is because cards are mounted on both sides of the LSI gate and because large cabling areas are provided between the MCC cards to permit installation of the high density cabling required between the MCC cards. This makes it possible to provide a relatively compact CPU which represents a significant reduction in size in comparison to predecessor CPU's.

The LSI gate 13 serves as a very advantageous means for the distribution of power and ground to the MCC cards 269. The construction of the LSI gate 13 makes it possible to obtain the desired ratio between the resistance of the power distribution buss and the ground distribution buss as, for example, a ratio of 3:1 for a purpose explained in copending application Ser. No. 270,449, filed July 10, 1972.

By way of example, one CPU constructed as hereinbefore described the cooling system was capable of maintaining circuit junction temperatures at not more than 85°C. and a temperature differential between different circuits of not more than 43° C. Forced air connection cooling provided 83 cfm of cooling air at not more than 32° C. inlet in each cooling column of three MCC cards to provide a resulting velocity of 1550 f.p.m. at the LSI chip carrier 277 at a static pressure of 0.45 inch $H_2O$ in a worst case situation operating at a 7000 feet altitude. With each card 269 dissipating approximately 156 watts and with 3 cards to a column and 14 columns, the CPU will dissipate approximately 6500 watts with the power supplies contributed approximately 2700 watts and the fans 500 watts for a total heat load of approximately 9700 watts.

It is apparent from the foregoing that there has been provided a central processor unit which has great capabilities but which is relatively compact in size. For this reason, it has been possible to obtain very high circuit speeds. To achieve this, cable lengths have been significantly decreased. The power and ground distribution system provides structural support for the MCC cards. The MCC cards form one side of the cooling channel which is utilized for cooling the chip carriers. The cooling system which is provided is one in which the heat from the power supply does not come in contact with the MCC cards. Adequate cooling is provided for the MCC cards and there is little loss of air velocity even when an MCC card is removed from a channel.

Ready access can be obtained to the MCC boards even though the LSI gate itself is fixed and serves as a power and ground buss as well as providing structural support for the MCC cards. In addition, even though the cooling air velocity is quite high, the cooling system is relatively quiet.

We claim:

1. In a computer construction, a framework, a power buss mounted in the framework, said power buss being in the form of a rigid laminated structure having a first plate of conducting material serving as a voltage plate and a second plate of a conducting material serving as a ground plate and insulating means disposed between said first and second plates, said laminated structure being formed with holes extending therethrough, printed circuit cards mounted on each side of said power buss and being supported thereby, said printed circuit cards being electrically connected to the voltage and ground plates and cabling means extending through said holes and interconnecting said printed circuit cards.

2. A computer construction as in claim 1 wherein said printed circuit cards are mounted on said power buss so that the cards lie in planes which are generally parallel to the planes of the voltage and ground plates together with stand-off means mounted on the power buss and on the printed circuit cards for spacing the printed circuit cards from the power buss.

3. A computer construction as in claim 2 wherein said stand-off means are in the form of voltage and ground posts and wherein said voltage posts are electrically connected to and mounted on said voltage plates and said ground posts are electrically connected to and mounted on said ground plate.

4. A computer construction as in claim 3 wherein said voltage and ground posts are provided on both sides of the power buss and wherein the voltage posts are mounted on the power buss so they are only in electrical contact with the voltage plate and wherein the ground posts are mounted on the ground plate so they are only in electrical contact with the ground plate.

5. A computer construction as in claim 4 wherein openings are formed for the voltage posts in the ground plate and the insulating material so that the voltage posts mounted upon the voltage plate are electrically isolated from the ground plate and wherein openings are formed in the voltage plate and the means insulating the voltage plate from the ground plate so that the ground posts mounted upon the ground plate are electrically isolated from the voltage plate.

6. A computer construction as in claim 3 wherein a plurality of voltage posts and ground posts are provided for each card.

7. A computer construction as in claim 3 wherein the voltage posts and the ground posts extend outwardly from the power buss at substantially right angles thereto.

8. A computer construction as in claim 1 together with connectors mounted on said cards and connected to the circuitry carried thereby.

9. A computer construction as in claim 8 together with a plurality of supplemental printed circuit cards and a connector mounted on each of the plurality of the first named and additional printed circuit cards, and means carried by the first named printed circuit card for making connection between the connectors carried by the plurality of the supplemental printed circuit cards and the connectors carried by the plurality of the first named printed circuit cards.

10. A computer construction as in claim 9 together with a terminal board mounted on each of said plurality of supplemental cards, and plugs mounted in said terminal cards and making contact to said plurality of supplemental printed circuit cards.

11. A computer construction as in claim 10 together with input/output cards, terminal boards carried by the input/output cards, plugs mounted in said terminal boards carried by the input/output cards and making electrical contact to the input/output cards and cabling interconnecting the plugs carried by the terminal boards of the supplemental cards and the plugs carried by the terminal boards of the input/output cards.

12. A computer construction as in claim 11 together with means for mounting said input/output cards in said framework so that they lie in generally horizontal planes and are inclined at an angle with the respect to the plane of the power buss.

13. A computer construction as in claim 12 wherein said means for mounting said input/output cards includes a framework having slots therein extending in a generally horizontal direction, said input/output printed circuit cards being mounted in said slots, said input/output cards having connectors mounted thereon, and means for causing said connectors carried by said input/output printed circuit boards to mate with each other.

14. A computer construction as in claim 13 wherein said means for causing said connectors to mate with each other includes strips extending longitudinally of the slots in the framework and jack screw means carried by the input/output cards threaded into said vertical members.

15. A computer construction as in claim 3 wherein said ground posts and said voltage posts are provided with slots therein extending longitudinally of the posts, said supplemental printed circuit cards being slidably mounted in said slots and generally extending in a direction at right angles to the plane of the first named printed circuit cards.

16. A computer construction as in claim 15 together with jack screw means carried by the first named printed circuit cards for making and breaking the connections between the connectors carried by the supplemental printed circuit cards and the first named printed circuit cards.

17. A computer construction as in claim 15 wherein at least one of said posts is provided with notches opening into said slots to permit at least one side of the supplemental circuit card carried by the slots in the posts can be removed from the slot in said one post.

18. A computer construction as in claim 3 wherein said ground and voltage posts and said first named printed circuit cards carry cooperative means to only permit placement of the first named printed circuit cards on the ground and voltage posts in one predetermined arrangement.

19. A computer construction as in claim 1 wherein said first named printed circuit cards are arranged in rows together with means for forming cooling channels over said rows and means for forcing cooling air through said cooling channels.

20. A computer construction as in claim 19 wherein said means for forcing cooling air through said cooling channels includes fan means for pushing cooling air through said channels in one direction and additional fan means for pulling cooling air through said channels in the same direction.

21. A computer construction as in claim 20 wherein said cooling channels are vertically disposed and said first named fan means located at the lower extremities of said cooling channels and said additional fan means is located at the upper extremities of said cooling channels.

22. A computer construction as in claim 19 wherein said means for mounting said first named printed circuit cards includes means whereby the first named printed circuit cards can be removed and inserted individually without impeding the flow of cooling air through the cooling channel in which the first named printed circuit card is mounted.

23. A computer construction as in claim 1 together with power supply means for supplying power to the power buss, means for supplying cooling air to the power supply means and means for directing the cooling air after it is passed through the power supply means away from the printed circuit cards so that it will not come into contact with the printed circuit cards.

24. In a computer construction, a framework, a plurality of printed circuit cards having devices mounted thereon and being mounted on said framework in a row, cover means overlying said printed circuit cards and in conjunction with said printed circuit cards forming a channel for the flow of cooling air and means for introducing cooling air through the channel to cool the devices carried by the printed circuit cards.

25. A computer construction as in claim 24 wherein said means for causing cooling air to pass through said cooling channel includes first and second fans with one of the fans pushing the cooling air through one end of the channel and the other fan pulling the air through the other end of the channel.

26. A computer construction as in claim 25 together with air straightening means in the channel to cause substantially uniform distribution of air flow through the channel.

27. A computer construction as in claim 24 wherein each of said printed circuit cards is substantially planar and is provided with a separate cover mounted thereon, said covers being substantially U-shaped so that the cover in combination with the printed circuit card forms a printed circuit card assembly, and wherein each of said printed circuit card assemblies forms a portion of a channel having open ends so that a plurality of said printed circuit card assemblies can be arranged to form said channel for cooling air.

28. A computer construction as in claim 27 together with transition assemblies mounted on opposite ends of said printed circuit card assemblies and having a flow passage therein for forming an interconnection between said printed circuit card assemblies so that said channel for cooling air is continuous.

29. A computer construction as in claim 28 wherein the printed circuit card assemblies and the transition assemblies are arranged so that the channel for cooling air is substantially vertical.

30. A computer construction as in claim 24 together with power supply means for supplying power to said printed circuit cards, means for introducing cooling air through the power supply means, and means for deflecting the air passing from the power supply means away from the printed circuit cards.

31. A computer construction as in claim 27 together with a power buss mounted in said framework and wherein said printed circuit card assemblies and said transition assemblies are mounted upon and are carried by said power buss.

32. A computer construction as in claim 31 wherein said power buss is comprised of a voltage plate and a ground plate and insulating means separating said voltage plate and said ground plate and wherein said printed circuit card assemblies are electrically connected to the ground plate and to the voltage plate.

33. A computer construction as in claim 32 wherein the ground plate has a resistivity substantially less than that of the voltage plate.

34. A computer construction as in claim 32 wherein said printed circuit card assemblies are mounted on opposite sides of the power buss.

35. In a method for cooling a computer utilizing printed circuit cards having devices mounted thereon, mounting the printed circuit cards in a plurality of spaced rows, forming cooling channels over the spaced rows of printed circuit cards, forcing cooling air under pressure through one end of the cooling channel and moving air under pressure from the other end of the cooling channel to thereby provide pushpull cooling in the cooling channel.

36. A method as in claim 36 together with the step of providing a power supply for supplying power to the printed circuit cards and supplying cooling air to the power supply and maintaining the air passing through the power supply out of contact with the printed circuit cards.

* * * * *